United States Patent
Chang et al.

(10) Patent No.: US 9,728,276 B2
(45) Date of Patent: Aug. 8, 2017

(54) INTEGRATED CIRCUITS WITH BUILT-IN SELF TEST MECHANISM

(71) Applicant: MediaTek Inc., Hsin-Chu (TW)

(72) Inventors: Shi-Wei Chang, Hsinchu (TW); Chia-Wei Wang, Taichung (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 14/750,102

(22) Filed: Jun. 25, 2015

(65) Prior Publication Data
US 2016/0093401 A1    Mar. 31, 2016

Related U.S. Application Data

(60) Provisional application No. 62/055,684, filed on Sep. 26, 2014.

(51) Int. Cl.
*G11C 7/00* (2006.01)
*G11C 29/44* (2006.01)

(52) U.S. Cl.
CPC .................. *G11C 29/4401* (2013.01)

(58) Field of Classification Search
CPC ...... G11C 29/4401; G11C 29/50; G11C 29/02
See application file for complete search history.

(56) References Cited

U.S. PATENT DOCUMENTS

| | | | |
|---|---|---|---|
| 6,769,081 B1* | 7/2004 | Parulkar | 714/733 |
| 6,941,499 B1* | 9/2005 | Sung | G06F 17/5022 703/15 |
| 7,423,442 B2* | 9/2008 | Steck, Jr. | G11C 29/56 324/73.1 |
| 2004/0085821 A1* | 5/2004 | Kim | G11C 29/76 365/200 |
| 2009/0097342 A1* | 4/2009 | Tseng | G11C 29/808 365/201 |
| 2010/0251043 A1* | 9/2010 | Anzou et al. | 714/719 |
| 2012/0144244 A1* | 6/2012 | Dan | G11C 29/10 714/39 |

* cited by examiner

*Primary Examiner* — Pho M Luu
*Assistant Examiner* — Mohammed A Bashar
(74) *Attorney, Agent, or Firm* — McClure, Qualey & Rodack, LLP

(57) ABSTRACT

An embodiment of the invention provides an integrated circuit including a core circuit and a memory. The core circuit executes operations of the integrated circuit. The memory stores a subsystem and a repair system. When the repair system runs, the repair system detects whether there is a defect in the memory. When the repair system detects the defect, the repair system repairs the defect, and when the repair system does not detect the defect, a fake defect is injected in the memory to verify whether the repair system runs correctly.

12 Claims, 9 Drawing Sheets

INTEGRATED CIRCUITS WITH BUILT-IN SELF TEST MECHANISM

CROSS REFERENCE TO RELATED APPLICATIONS

This application claims the benefit of U.S. Provisional Application No. 62/055,684 filed on Sep. 26, 2014, the entirety of which is incorporated by reference herein.

BACKGROUND OF THE INVENTION

Field of the Invention

The present invention relates to a memory, and more particular to the memory with a self-testing mechanism.

Description of the Related Art

Integrated circuits (ICs) have become complex due to increased functionality and high performance. Many ICs include on-chip memory. On-chip memory may take on a variety of forms, for example, a random access memory (RAM), a read-only memory (ROM), a programmable read-only memory (PROM), a non-volatile memory (NVRAM), a flash memory, etc. Among these kinds of memory, random access memory and the read-only memory are most commonly used in the chips, such as a processor, a controller or a digital processing unit (DSP). Since the content stored in a read-only memory cannot be modified, the read-only memory is used to store the main core or main operating system of the chip. The random access memory is normally associated with volatile types of memory, where stored information is lost if power is removed, thus the random access memory usually stores parameters or temporary data generated during an operation of the chip.

Due to the increasing complexity of ICs, additional elements may cause errors on the chip. To avoid shipping defect chips, a testing mechanism is required to find the defective chips. The traditional defect detecting mechanism uses an external ATE (automatic test equipment) to test chips, but it costs time and is not an economical approach. Therefore, another testing mechanism, the Built-in Self Test (BIST), is proposed for some particular circuits, such as a chip with embedded memory. The technique allows the chip to perform a self-testing procedure using additional hardware or software integrated in the chip. The self-testing procedure tests operations (functionally, parametrically, or both) of the chip by using the additional hardware or software of the chip, wherein the software may be stored in the memory. Thus, the new testing mechanism reduces dependence on the external automated test equipment. Although the BIST mechanism provides a relatively efficient approach for chip-testing, however, traditional testing procedures cannot be used for on-the-fly validation or diagnosis. The traditional BIST mechanism needs to be improved.

BRIEF SUMMARY OF THE INVENTION

An embodiment of the invention provides an integrated circuit comprising a core circuit and a memory. The core circuit executes operations of the integrated circuit. The memory stores a subsystem and a repair system. When the repair system runs, the repair system detects whether there is a defect in the memory. When the repair system detects the defect, the repair system repairs the defect, and when the repair system does not detect the defect, a fake defect is injected in the memory to verify whether the repair system runs correctly.

Another embodiment of the invention provides a built-in test method for an integrated circuit, wherein the integrated circuit comprises a core circuit, a memory storing a subsystem and a repair system. The method comprises: detecting, by the repair system, whether there is a defect existed in the memory; repairing the defect, by the repair system, and generating a repair result when the defect is detected by the repair system; and verifying the repair system to check whether the repair system runs normally when no defect is detected.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
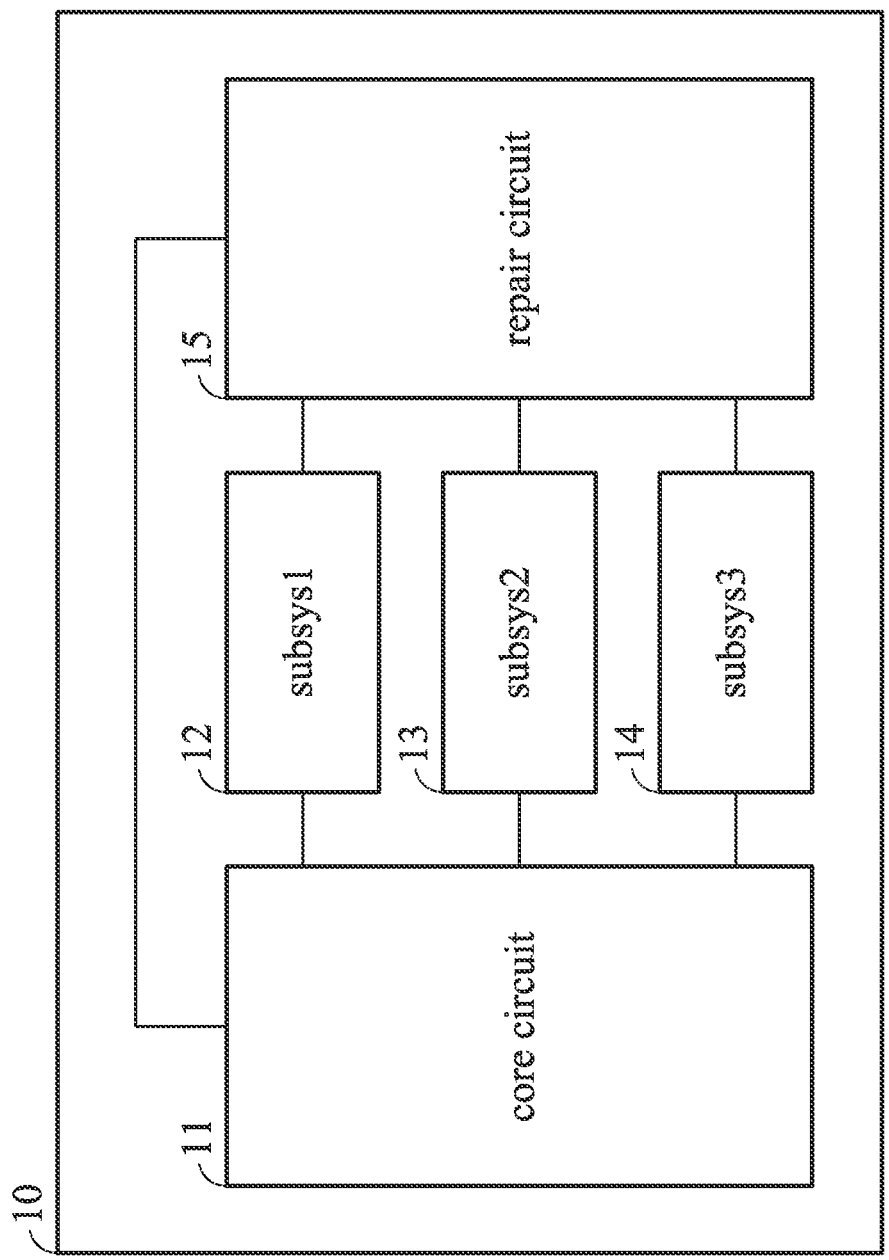
FIG. 1 is a schematic diagram of a chip.

FIG. 1 is a schematic diagram of a chip. The chip 10 comprises a core circuit 11, a repair circuit 15, a first RAM 12 storing a first subsystem subsys1, a second RAM 13 storing a second subsystem subsys2, and a third RAM 14 storing a third subsystem subsys3. The core circuit 11 processes functionalities and operations of the chip 10, and the repair circuit 15 is used to detect defects in the first RAM 12, the second RAM 13 and the third RAM 14. When the first subsystem subsys1, for example, runs, defects in the first RAM 12 may cause errors and the chip 10 may be nonfunctional. The repair circuit 15 continuously detects whether there is any defect in the first RAM 12, the second RAM 13 and the third RAM 14 when the first subsystem subsys1, the second subsystem subsys2, and the third subsystem subsys3 run, and repairs the detected defects. In FIG. 1, the repair circuit 15 deals with the defect detecting and repairing of the first RAM 12, the second RAM 13 and the third RAM 14, but the invention is not limited thereto.

Figure 2:
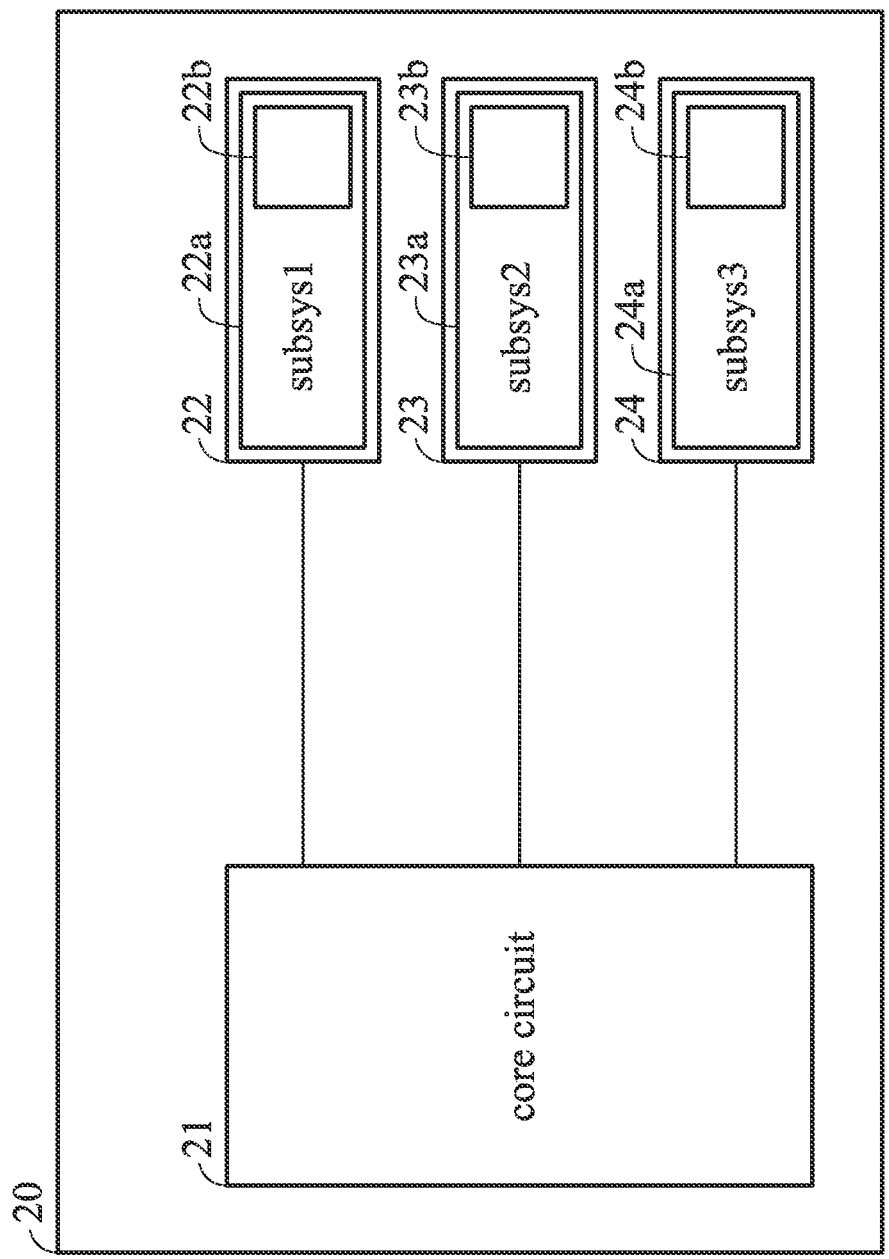
FIG. 2 is a schematic diagram of a chip according to an embodiment of the invention.

FIG. 2 is a schematic diagram of a chip according to an embodiment of the invention. The chip 20 comprises a core circuit 21, a first RAM 22 storing a first subsystem 22a, labeled as subsys1, a second RAM 23 storing a second subsystem 23a, labeled as subsys2, and a third RAM 24 storing a third subsystem 24a, labeled as subsys3. The first subsystem 22a comprises a first repair system 22b to detect and repair defects that occur in the first RAM 22. The second subsystem 23a comprises a second repair system 23b to detect and repair defects in the second RAM 23. The third subsystem 24a comprises a third repair system 24b to detect and repair defects occurred in the third RAM 24. In this embodiment, the repair systems 22b, 23b and 24b are a part of corresponding subsystem, and in another embodiment, the repair systems 22b, 23b and 24b are independent from the subsystems.

When the first subsystem 22a runs, the first repair system 22b detects whether there is a defect occurring in the first RAM 22. If the first repair system 22b detects the defect of the first RAM 22, the first repair system 22b repairs the defect according to a predetermined repair approach, such as blocking a memory block or a memory column. When the second subsystem 23a runs, the second repair system 23b detects whether there is a defect occurred in the second RAM 23. If the second repair system 23b detects the defect of the second RAM 23, the second repair system 23b repairs the defect according to a predetermined repair approach, such as replacing the defective memory column with a redundant memory column. When the third subsystem 24a runs, the third repair system 24b detects whether there is a defect occurred in the third RAM 24. If the third repair system 24b detects the defect of the third RAM 24, the third repair system 24b repairs the defect according to a predetermined repair approach.

The repair systems 22b, 23b and 24b may be a hardware circuit, or a software or firmware executed by the core circuit 21. Although the chips shown in FIGS. 1 and 2 disclose a BIST mechanism, the BIST mechanism may not function normally because the repair mechanism has failed or is nonfunctional.

Figure 3:
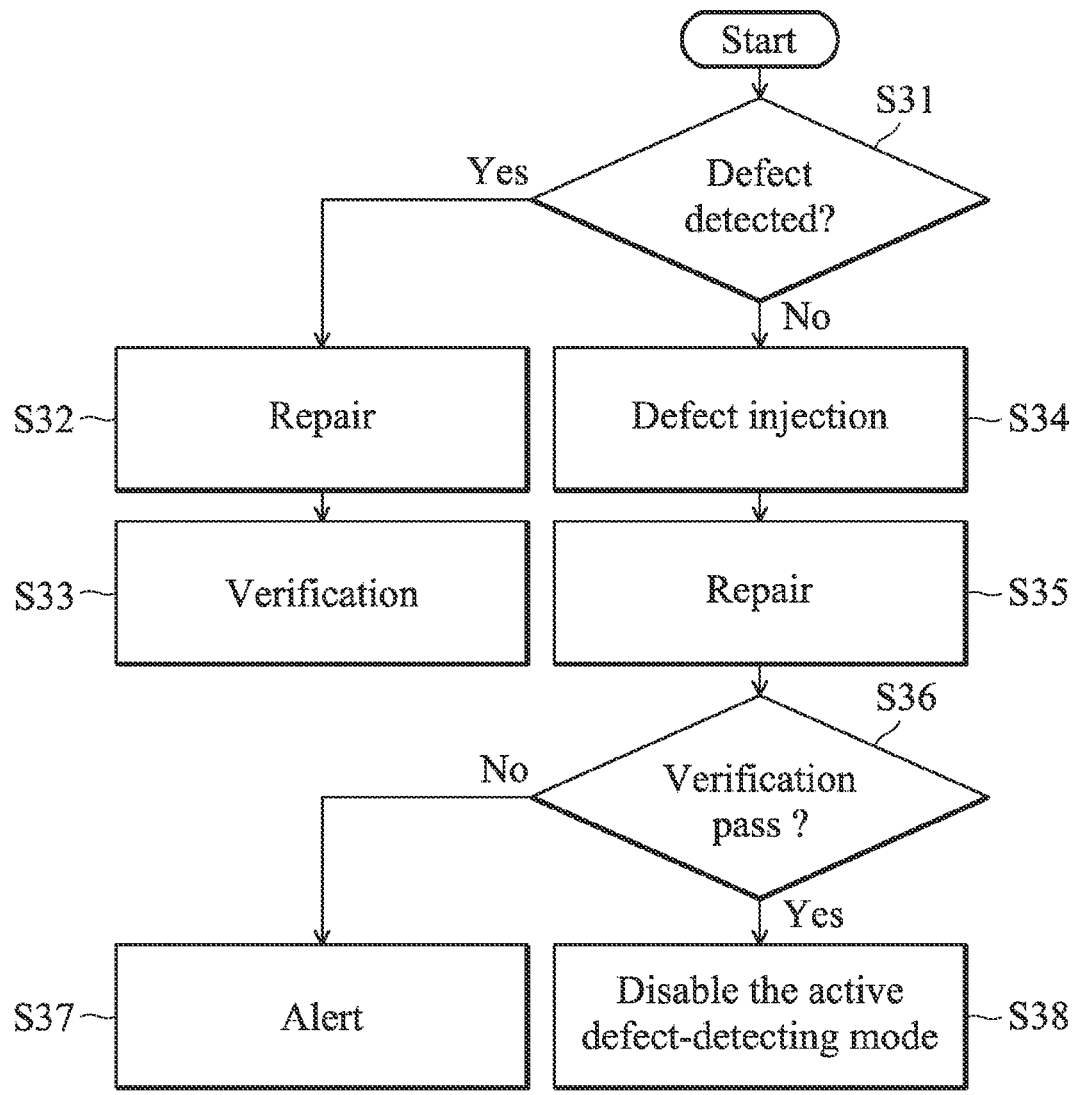
FIG. 3 is a flowchart of a memory self-testing method according to an embodiment of the invention.

FIG. 3 is a flowchart of a memory self-testing method according to an embodiment of the invention. The memory self-testing method is applied to a chip with embedded memory, and the method is executed by a core circuit of the chip. The chip comprises a core circuit and a memory, wherein a subsystem is stored in the memory. In this embodiment, a repair system is provided to detect and repair defects of the memory. The repair system may be a part of the subsystem activated by the core circuit or a part of the core circuit. The memory self-testing method is not only a test-repair method, but a method capable of detecting and repairing defects on the embedded memory, and verifying whether the repair system has failed.

In step S31, the repair system detects whether there is a defect of the embedded memory. If the repair system does not detect a defect, step S34 is then executed. If it does, step S32 is executed. In step S32, the repair system repairs the defect according to preset repair approaches. In this embodiment, the repair system may comprise a repair library storing a plurality of defect-repair behaviors. The defect-repair behavior records the defect type of the detected defect and a corresponding repair behavior. For example, assuming that the detected defect is a memory column failure; the corresponding repair behavior may be replacing the failed memory column with a redundant memory column. After the defect is fixed, step S33 is executed. The repair system verifies whether the defect is fixed. In another embodiment, the step S33 comprises a two-stage verification. First, the repair system verifies whether the defect is fixed. Second, the core circuit verifies the repair system according to the detected defect type and the repair behavior adopted by the repair system.

Back to step S34. It does not mean that there is no defect in the embedded memory when the repair system does not detect defects. It may be that the repair system has broken down. To make sure the result of step S31 is correct; the repair system needs to be verified first. In step S34, an active defect-detecting mode is activated. The core circuit injects a defect to the embedded memory and informs the repair system to repair the defect. A defect model library is provided for the core circuit. The core circuit chooses at least one defect model or at least one defect pattern, and acquires a corresponding correct repair approach. In step S35 the repair system repairs the injected defect. In the step S36, the core circuit verifies the repair result and determines whether the repair system passes the repair test.

If the repair system has passed the test, step S38 is executed. The core circuit disables the active defect-detecting mode of the chip. If the repair system does not pass the test, step S37 is executed to output an alert signal, and the chip is classified as defective. In this embodiment, a BIST mechanism applied to the chip comprises two parts: the repair system for detecting and repairing defects, and a verification mechanism to verify the repair system. According to the disclosed method, the BIST mechanism becomes more complete because the method shown in FIG. 3 can verify the BIST mechanism to ensure the BIST mechanism can operate normally.

Figure 4:
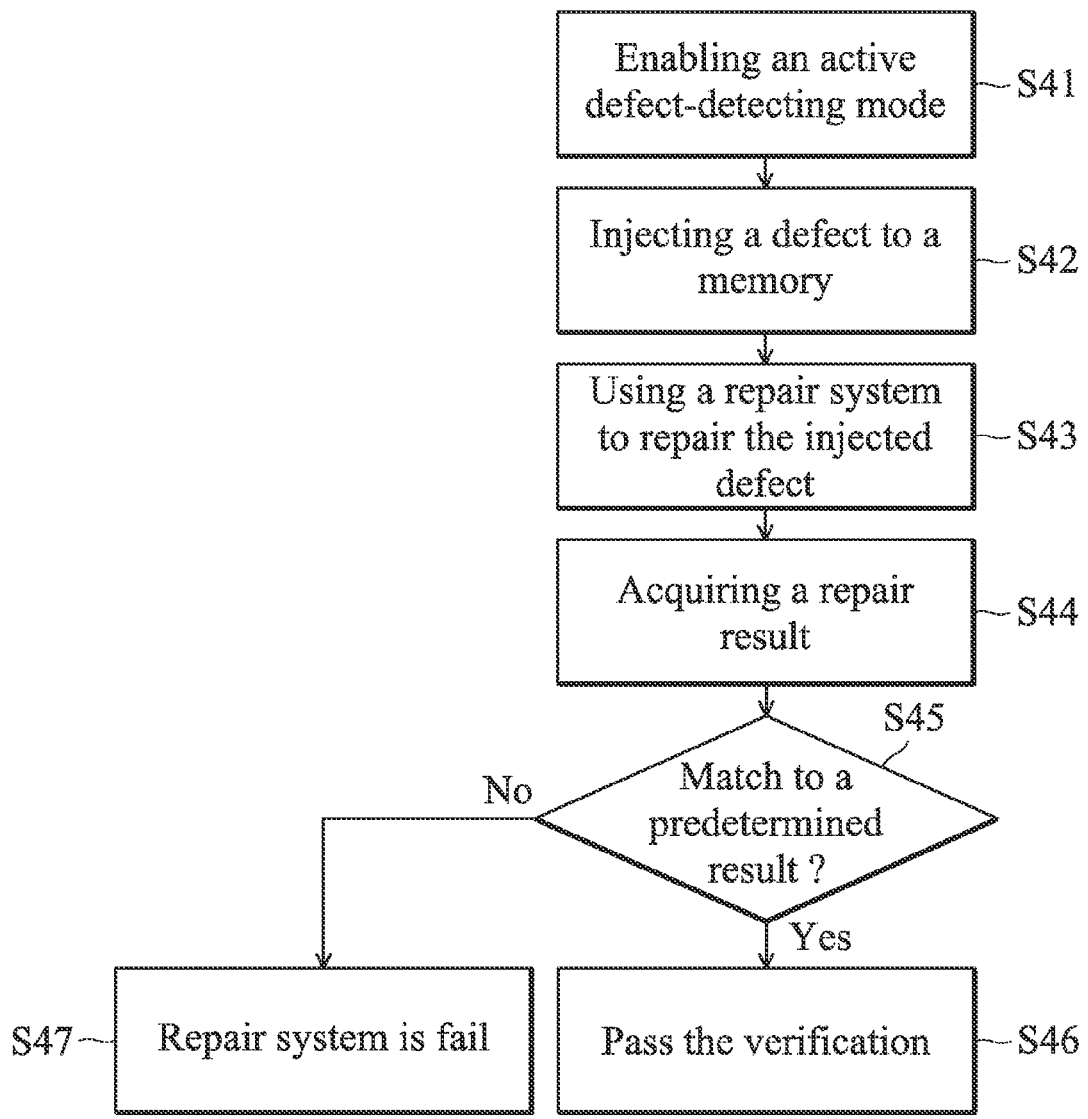
FIG. 4 is a flowchart of a memory self-testing method according to another embodiment of the invention.

FIG. 4 is a flowchart of a memory self-testing method according to another embodiment of the invention. The memory self-testing method is applied to a chip with embedded memory, and the method is executed by a core circuit of the chip. The chip comprises a core circuit and a memory, wherein a subsystem is stored in the memory. The memory operates in two different modes: a normal mode and an active self-testing mode. When the memory operates in the normal mode, the memory can be read and written, and when a defect of the memory is found, a repair system repairs it. In this embodiment, the defect is a hardware defect, such as a damaged memory column or a damaged memory row. When the memory operates in the active self-testing mode, the operation discussed in the following paragraphs is followed.

In step S41, the active self-testing mode of the memory is enabled. In one embodiment, the active self-testing mode is enabled by the core circuit according to instructions from a user. In another embodiment, the memory comprises a specific pin and when the logic level of the specific pin is changed from a first state to a second state, the active self-testing mode of the memory is enabled. In step S42, the core circuit injects a defect to the embedded memory and instructs the repair system to repair the defect.

A defect model library is provided to the core circuit, wherein the defect model library comprises a plurality of defect types and corresponding repair approaches. For example, the defect type is a failed memory column, and the corresponding repair approach to replace the failed memory column with a redundant memory column. Note that one defect type may have several repair approaches. The core circuit chooses at least one defect model or at least one defect pattern, and acquires at least one corresponding correct repair approach. Then, the defect is injected to the memory.

In step S43, the repair system repairs the injected defect. The repair system may also have a defect-repair library that is the same as the defect model library or the content of the defect-repair library is the same as the content of the defect model library. Note that all the defect types in the defect model library must be included in the defect-repair library, and the corresponding repair approaches are the same in both libraries. In step S44, the core circuit acquires a repair result from the repair system. The repair result may comprise a defect model and an adopted repair approach.

In step S45, the core circuit verifies whether the repair system adopts a corresponding repair approach of the chosen defect to determine whether the repair system passes the repair test. If the core circuit confirms that the repair result matches a predetermined result, the repair system passes the verification for the repair system in step S46. If the core circuit confirms that the repair result does not match a predetermined result, the repair system fails to pass the verification for the repair system in step S47. According to the method of FIG. 4, we can filter out the chips with failed BIST mechanisms to increase the reliability of chips.

Figure 5:
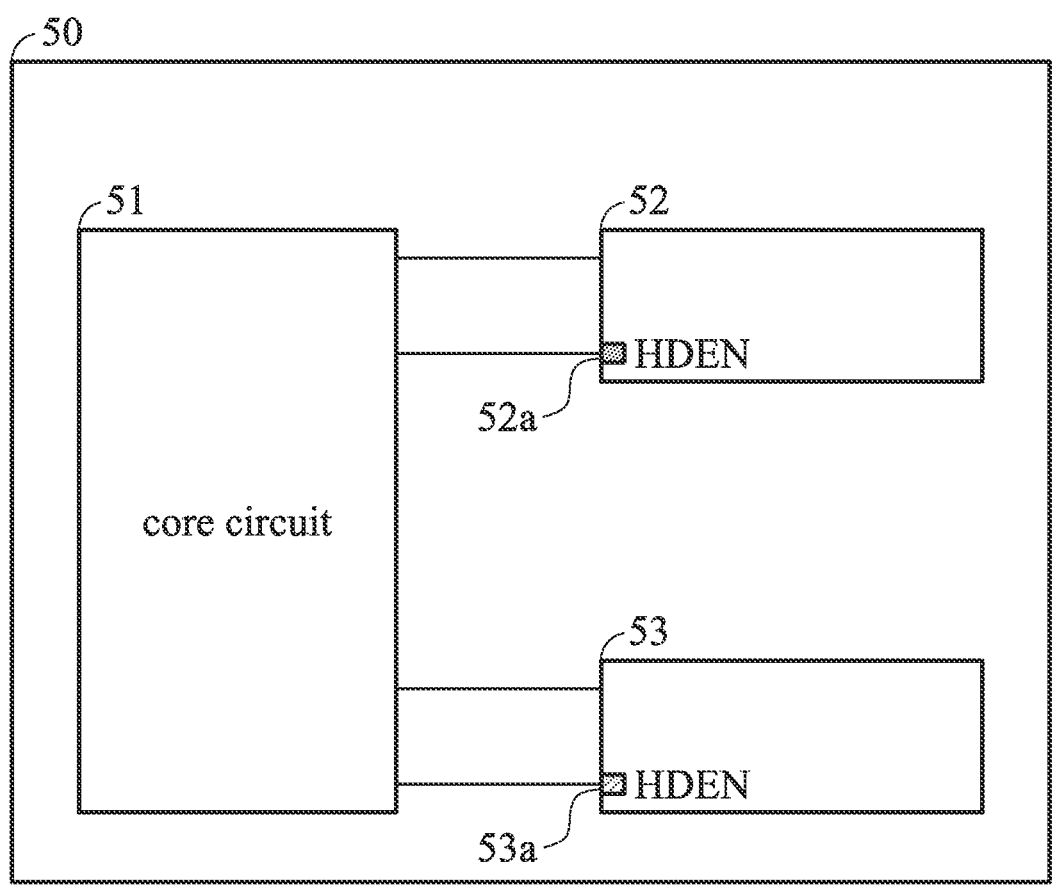
FIG. 5 is a schematic diagram of a chip with a BIST mechanism according to an embodiment of the invention.

FIG. 5 is a schematic diagram of a chip with a BIST mechanism according to an embodiment of the invention. The chip 50 comprises a core circuit 51, a first memory 52 and a second memory 53, wherein the first memory 52 comprises a first test pin 52a, labeled as HDEN, and the second memory 53 comprises a second test pin 53a, labeled as HDEN. The first memory 52 and the second memory 53 store a first subsystem and a second subsystem, respectively. The first subsystem comprises a first repair system to repair defects of the first memory 52, and the second subsystem comprises a second repair system to repair defects of the second memory 53.

In this embodiment, the first repair system and the second repair system have a self-verifying function to verify the repair system itself. The self-verifying function avoids the error repair system doing error defect-detecting and error defect-repairing. The self-verifying is enabled by changing the logic state of the first test pin 52a and the second test pin 53a. In this embodiment, the core circuit 51 changes the logic state of the first test pin 52a and the second test pin 53a according to the user's instructions. The first test pin 52a and the second test pin 53a are only accessed by the core circuit 51 in this embodiment.

The following paragraphs illustrate the self-verifying function with the first memory 52, for example. When the core circuit 51 receives an instruction to verify the first repair system, the core circuit 51 changes the logic state of the first test pin 52a. Then, the core circuit injects a defect into the first memory 52 and instructs the first repair system to repair the injected defect.

In this embodiment, a defect model library is provided to the core circuit 51, wherein the defect model library comprises a plurality of defect types and corresponding repair approaches. For example, the defect type is a failed memory column, and the corresponding repair approach is replacing the failed memory column with a redundant memory column. Note that one defect type may have several repair approaches. The core circuit 51 chooses at least one defect model or at least one defect pattern, and acquires a corresponding correct repair approach. Then, the defect is injected to the first memory 52.

The repair system detects the defect and repairs the injected defect based on the defect type of the injected defect. The repair system may also have a defect-repair library that is the same as the defect model library. In another embodiment, the defect model library is a part of the defect-repair library to ensure that all the defect types in the defect model library have been included in the defect-repair library.

After repairing the defect, the core circuit 51 acquires a repair result from the repair system. The repair result may comprise a defect model and an adopted repair approach. The core circuit 51 verifies whether the repair system adopts correct repair approach of the chosen defect to determine whether the repair system has passed the repair test. If the core circuit 51 confirms that the repair result matches a predetermined result, the repair system passes the verification. If the core circuit 51 confirms that the repair result does not match to a predetermined result, the repair system fails to pass the verification and the chip 50 is classified as a defective chip.

Figure 6:
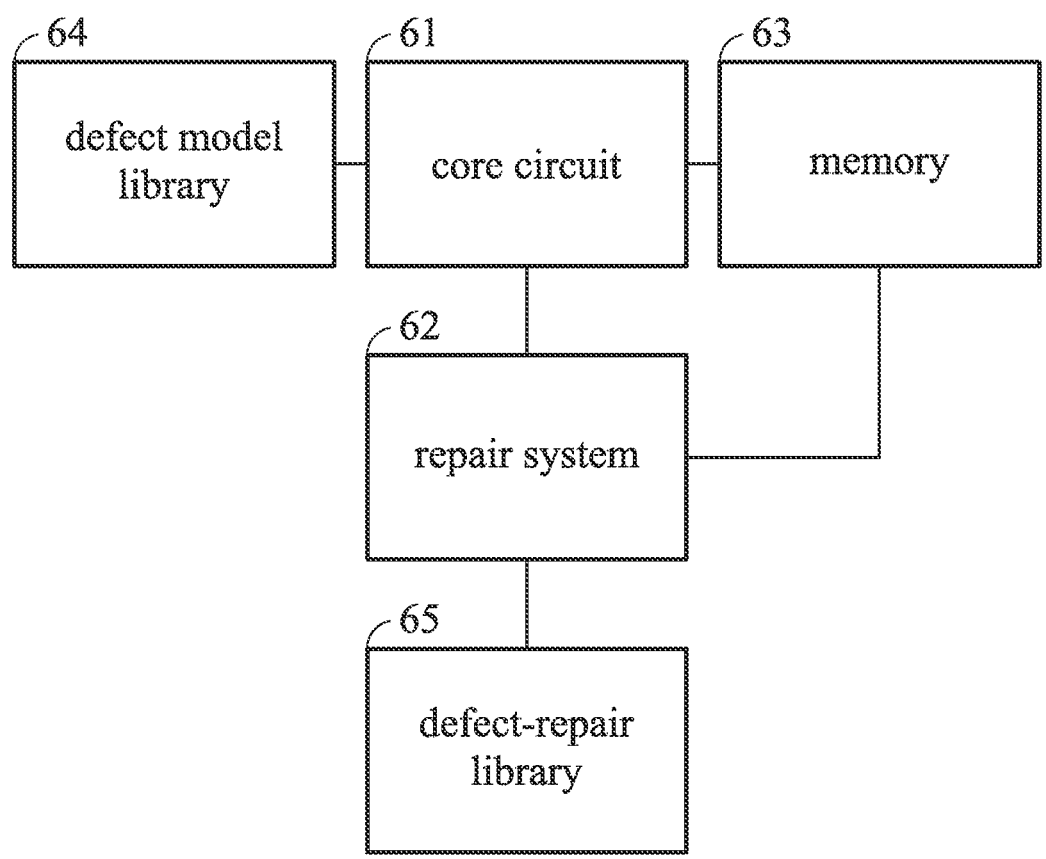
FIG. 6 is a functional block diagram of an integrated circuit according to an embodiment of the invention.

FIG. 6 is a functional block diagram of an integrated circuit according to an embodiment of the invention. The integrated circuit comprises a core circuit 61, a repair system 62, a memory 63, a defect model library 64, and a defect-repair library 65. In FIG. 6, all the functional blocks 61-65 may be hardware, software or a combination of hardware and software. The functional blocks 61-65 may be integrated in one module, processing unit or dispersed in different circuits. Note that the operations among functional blocks 61-65 are not limited to the integrated circuit, the operations among functional blocks 61-65 can be applied to an electronic device or an electronic system having a plurality of electronic devices.

The repair system 62 detects and repairs defects in the memory 63 according to defect types and repair approaches stored in the defect-repair library 65. When the repair system 62 repairs a defect of the memory 63, the core circuit 61 acquires a repair result from the repair system 62. Then, the core circuit 61 verifies the repair result according to the defect types and repair approaches stored in the defect model library 64 to check whether the repair system 62 operates normally.

When the repair system 62 does not detect a defect in the memory 63 and the core circuit 61 needs to check whether the repair system 62 operates normally, the core circuit 61 sets a fake defect in the memory 63 and instructs the repair system 62 to repair it. The fake defect is selected from the defect model library 64 by the core circuit 61 or input by a user. The defect model library 64 comprises a plurality of defect type and corresponding repair approach. For example, the defect type is a failed memory column, and the corresponding repair approach is replacing the failed memory column with a redundant memory column. Note that one defect type may have several repair behaviors. The different repair behavior requires different hardware resource and the repair system 62 adopts one repair behavior according to current hardware resource.

After repairing the defect, the core circuit 61 acquires a repair result from the repair system 62. The repair result may comprise a defect model and an adopted repair approach. The core circuit 61 verifies whether the repair system adopts correct repair approach of the chosen defect to determine whether the repair system passes the repair test. If the core circuit 61 confirms that the repair result matches to a predetermined result, the repair system passes the verification. If the core circuit 61 confirms that the repair result does not match to a predetermined result, the repair system fails to pass the verification and the integrated circuit may be malfunction.

Figure 7:
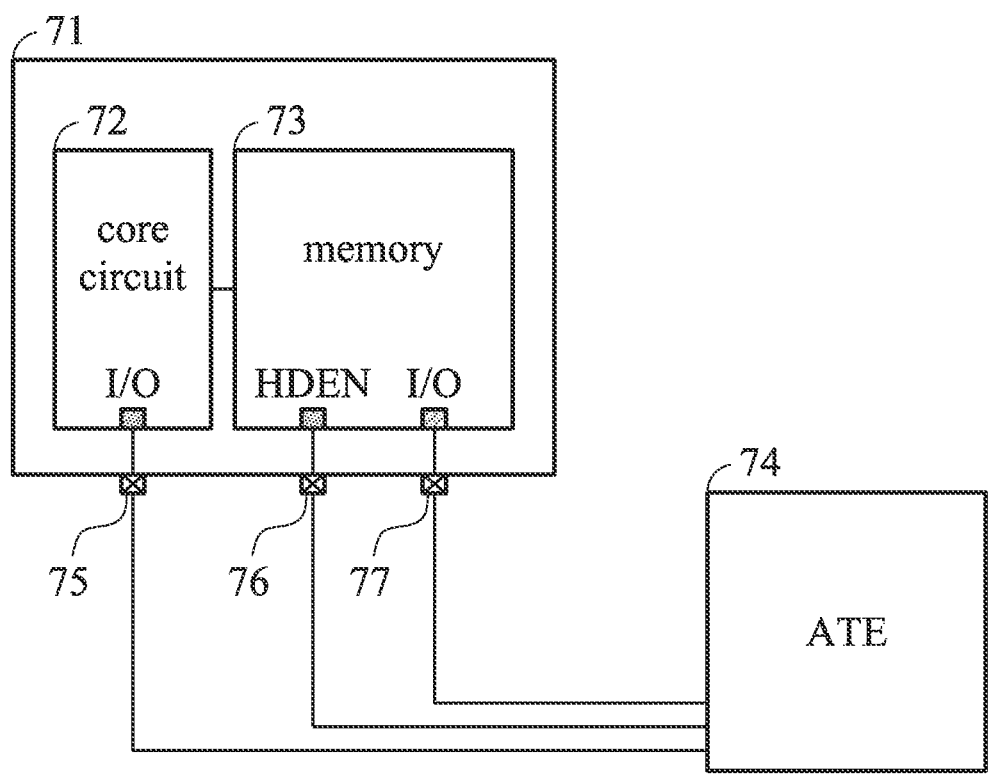
FIG. 7 is a schematic diagram of a chip testing system according to an embodiment of the invention.

FIG. 7 is a schematic diagram of a chip testing system according to an embodiment of the invention. In this embodiment, the fake defect is input by an external ATE (automatic test equipment) 74. The ATE 74 checks whether a repair system embedded in the memory 73 operates normally. The repair system is used to detect and repair the defect in the memory 73. The chip 71 comprises a first pin 75, a second pin 76 and a third pin 77, wherein the first pin 75 is connected to an I/O pin of the core circuit 72, the second pin 76 is connected to a HDEN pin of the memory 73, and the third pin 77 is connected to an I/O pin of the memory. Note that the first pin 75, the second pin 76 and the third pin 77 can be replaced with contact pads.

The repair system periodically detects the memory 73 to check whether there is a defect in the memory 73. If the repair system detects the defect, the repair system repairs the defect according to predetermined defect-repair behaviors. The defect-repair behavior records the defect type of the detected defect and the corresponding repair behavior. For example, assuming that the detected defect is a memory column failure; the corresponding repair behavior to replace the failed memory column with a redundant memory column. After the defect is fixed, the repair system or the core circuit 72 verifies whether the defect is correctly fixed. If the verification is fail, the core circuit 72 will check whether the functionality of the repair system is normal.

If the repair system does not detect a defect in the memory 73, it does not mean that the memory 73 is OK. The repair system may be fail, so that the defect is not detected. Therefore, a verification procedure is necessary to check whether the functionality of the repair system is normal. Note that the repair system verification procedure can be executed by instructions from a user, periodically or at a specific time. The specific time may be at a testing stage of the manufacturer.

At the beginning of the repair system verification procedure, a fake defect is injected in the memory 73. The fake defect may be caused by the core circuit 72 or the ATE 74. A defect model library is provided to the core circuit 72 or the ATE 74, wherein the defect model library comprises a plurality of defect type and corresponding repair approach. For example, the defect type is a failed memory column, and the corresponding repair approach is replacing the failed memory column with a redundant memory column. Note that one defect type may have several repair approaches. The core circuit 72 or the ATE 74 chooses at least one defect model or at least one defect pattern, and acquires corresponding correct repair approach.

Then, the core circuit 72 or the ATE 74 enables the repair system to detect the memory 73. When the repair system detects the fake defect, the repair system repairs the fake defect according to a defect type of the fake defect. The repair system accesses a defect-repair library to find a repair solution. After the repair system repairs the fake defect, the repair system generates a repair result.

The core circuit 72 or the ATE 74 acquires a repair result from the repair system. The repair result may comprise a defect model and an adopted repair approach. The core circuit 72 or the ATE 74 verifies whether the repair system adopts correct repair approach of the chosen defect to determine whether the repair system passes the repair test. If the core circuit 72 or the ATE 74 confirms that the repair result matches to a predetermined result, the repair system passes the verification. If the core circuit 72 or the ATE 74 confirms that the repair result does not match to a predetermined result, the chip 71 is classified as a defect chip, and cannot be shipped. In one embodiment, when the ATE 74 finds that the chip 71 cannot pass the repair system verification procedure, the ATE 74 informs the user that the chip 71 is defective.

Figure 9A:
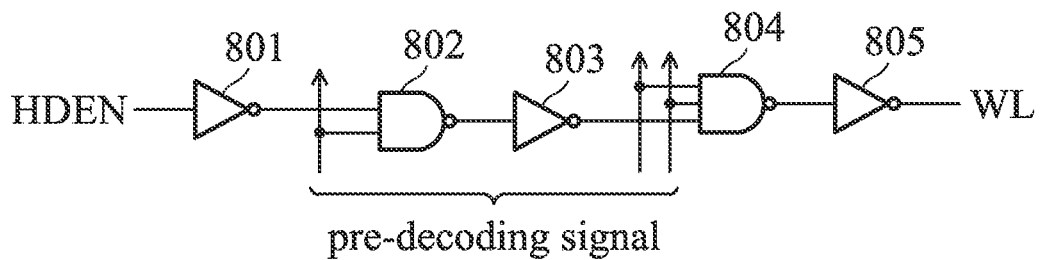
FIG. 9A is a circuit diagram of a circuit to generate a fake word line defect according to an embodiment of the invention.
Figure 9B:
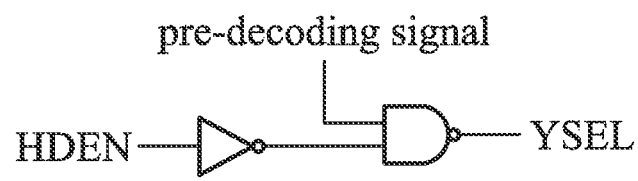
FIG. 9B is a circuit diagram of a circuit to generate a fake bit line defect according to an embodiment of the invention.
Figure 9C:
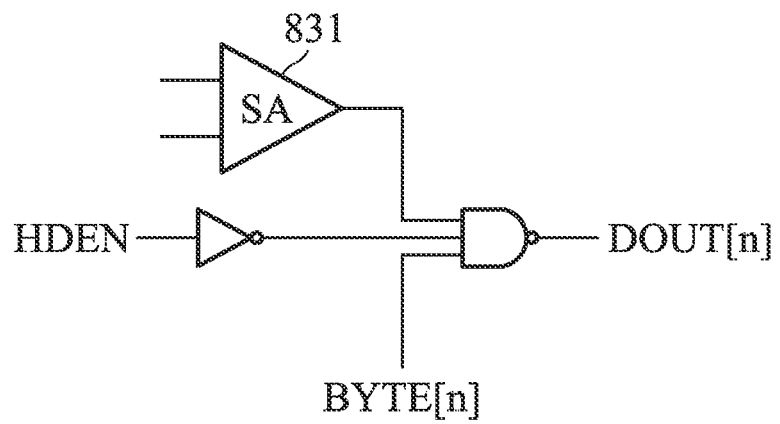
FIG. 9C is a circuit diagram of a circuit to generate a fake memory block defect according to an embodiment of the invention.

In the present application, we use a fake defect to check whether the repair system of an integrated circuit. FIG. 9A-FIG. 9C show three types of fake defects that can be applied in the invention. The three types of the fake defect are a word line defect, a bit line defect and a block defect.

Figure 8:
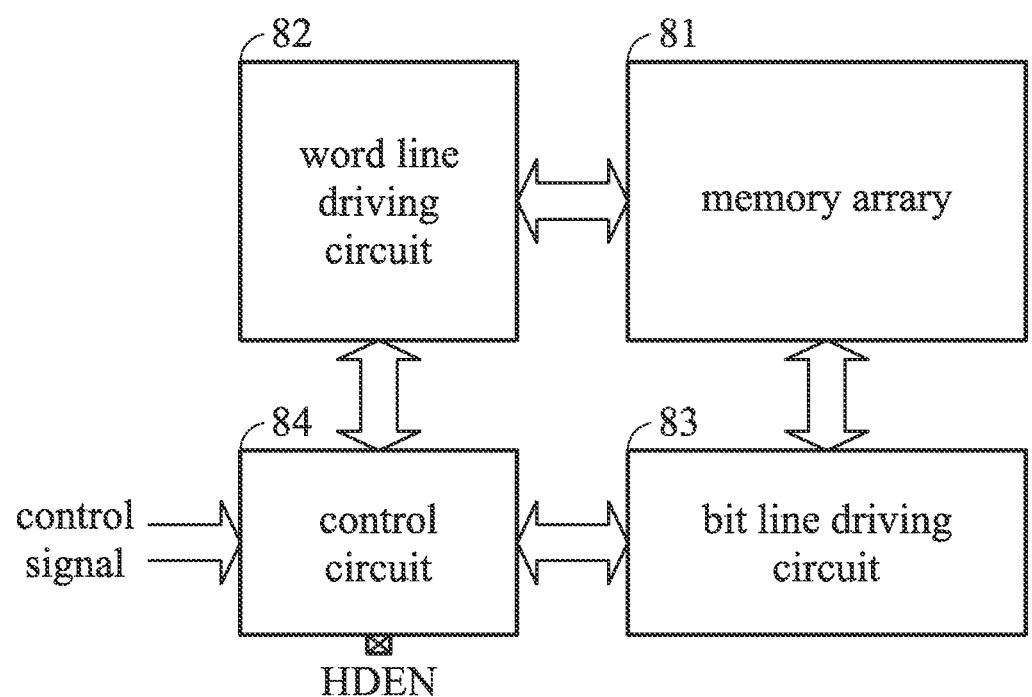
FIG. 8 is a schematic diagram of a memory module.

FIG. 8 is a schematic diagram of a memory module. The memory module comprises a memory array 81, a word line driving circuit 82, a bit line driving circuit 83 and a control circuit 84. The control circuit 84 couples to a HDEN pin and when the logic state of the HDEN pin is changed to a first state, the control circuit 84 causes a fake defect in the memory array 81.

FIG. 9A is a circuit diagram of a circuit to generate a fake word line defect according to an embodiment of the invention. The NOT gate 801 is coupled to an input terminal of the NAND gate 802, wherein another input terminal of the NAND gate 802 receives a predecoding signal. The output of the NAND gate 802 is coupled to a NAND gate 804 via a NOT gate 803. The NAND gate 804 has three input terminal, wherein one input terminal is coupled to an output terminal of the NOT gate 803, and the other two input terminals receive the predecoding signal. The word line is coupled to the output terminal of the NAND gate 804 via another NOT gate 805.

When the word line WL is selected, the pre-decoding signal is also logic 1. Under the normal conditions, the HDEN is not activated, and the word line WL can be activated normally. If the HDEN is activated, the word line WL is disabled, the memory cell connected to the word line WL cannot be accessed, the repair system determines that the word line WL is damaged, and executes corresponding repair behaviors. According to that, a fake word line defect is created.

FIG. 9B is a circuit diagram of a circuit to generate a fake bit line defect according to an embodiment of the invention. The signal YSEL indicates one bit line. When the HDEN is activated, the signal YSEL is logic 0, and the bit line coupled to the signal YSEL is disabled. Even if the bit line is selected, the control circuit still cannot access memory cells connected to the bit line.

FIG. 9C is a circuit diagram of a circuit to generate a fake memory block defect according to an embodiment of the invention. The sensing amplifier 831 couples to a plurality of bit lines, and when the HDEN is activated, the output data DOUT[n] is always zero. This causes the repair system to determine that a memory block coupled to the sensing amplifier 831 has failed. A fake memory block defect is generated.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An integrated circuit, comprising:
 a core circuit to execute operations of the integrated circuit; and
 a memory storing a subsystem and a repair system, wherein when the repair system runs, the repair system detects whether there is a defect in the memory, when the repair system detects the defect, the repair system repairs the defect according to a repair approach selected from a defect-repair library, and when the repair system does not detect a defect, a fake defect is injected into the memory to verify whether the repair system runs correctly, wherein the core circuit is further configured to:

access a defect model library which stores repair approaches for repairing different types of fake defects;

acquire one of the repair approaches from the defect model library as an expected repair approach, the expected repair approach corresponding to the fake defect injected into the memory;

enable the repair system to detect the memory for the fake defect injected into the memory and acquire an actual repair approach adopted by the repair system according to the defect-repair library in response to a detection of the fake defect injected into the memory; and check whether the actual repair approach adopted by the repair system according to the defect-repair library matches the expected repair approach acquired from the defect model library to determine whether the repair system runs correctly.

2. The integrated circuit as claimed in claim 1, wherein the repair system is a part of the subsystem.

3. The integrated circuit as claimed in claim 1, wherein the memory is a first memory, the subsystem is a first subsystem, the repair system is a first repair system, and the integrated circuit further comprises:

a second memory storing a second subsystem and a second repair system, wherein when the second repair system runs, the second repair system detects whether there is a defect in the second memory, when the second repair system detects the defect, the second repair system repairs the defect, and when the second repair system does not detect the defect, another fake defect is injected in the second memory to verify whether the second repair system runs correctly.

4. The integrated circuit as claimed in claim 1, wherein the fake defect is injected by the core circuit.

5. The integrated circuit as claimed in claim 1, wherein the memory further comprises a control circuit, the control circuit is coupled to a pin, and when a logic state of the pin is changed, the control circuit generates the fake defect.

6. The integrated circuit as claimed in claim 1, wherein the fake defect is a word line defect, a bit line defect or a block defect.

7. The integrated circuit as claimed in claim 1, wherein the fake defect is injected from an external testing device.

8. The integrated circuit as claimed in claim 1, wherein the subsystem and the repair system are run by the core circuit.

9. An built-in test method for an integrated circuit, wherein the integrated circuit comprises a core circuit, a memory storing a subsystem and a repair system, the method comprising:

detecting, by the repair system, whether there is a defect in the memory;

repairing the defect, by the repair system according to a repair approach selected from a defect-repair library;

verifying the repair system by injecting a fake defect into the memory to check whether the repair system runs normally when no defect is detected;

accessing a defect model library which stores repair approaches for repairing different types of fake defects;

acquiring one of the repair approaches from the defect model library as an expected repair approach, the expected repair approach corresponding to the fake defect injected into the memory;

enabling the repair system to detect the memory for the fake defect infected into the memory and acquiring an actual repair approach adopted by the repair system according to the defect-repair library in response to a detection of the fake defect injected into the memory; and checking whether the actual repair approach adopted by the repair system according to the defect-repair library matches the expected repair approaches acquired from the defect model library to determine whether the repair system runs correctly.

10. The built-in test method as claimed in claim 9, wherein the memory further comprises a control circuit, the control circuit is coupled to a pin, and when a logic state of the pin is changed, the control circuit generates and injects the fake defect to the memory for verifying the repair system.

11. The built-in test method as claimed in claim 9, wherein the fake defect is a word line defect, a bit line defect or a block defect.

12. The built-in test method as claimed in claim 9, wherein the fake defect is injected from an external testing device.

* * * * *